(12) United States Patent
Samarasooriya et al.

(10) Patent No.: US 8,373,759 B2
(45) Date of Patent: Feb. 12, 2013

(54) WHITE SPACE SPECTRUM SENSOR FOR TELEVISION BAND DEVICES

(75) Inventors: Vajira Samarasooriya, Ottawa (CA); Shiquan Wu, Nepean (CA)

(73) Assignee: Wi-LAN, Inc., Ottawa (CA)

( * ) Notice: Subject to any disclaimer, the term of this patent is extended or adjusted under 35 U.S.C. 154(b) by 721 days.

(21) Appl. No.: 12/543,259

(22) Filed: Aug. 18, 2009

(65) Prior Publication Data

US 2011/0043710 A1 Feb. 24, 2011

(51) Int. Cl.
*H04N 17/00* (2006.01)
(52) U.S. Cl. ........ 348/192; 348/181; 348/731; 348/732; 348/735; 348/E5.097; 455/509; 455/226.1; 455/226.2
(58) Field of Classification Search .................. 348/192, 348/181, 731, 732, 735, E5.097, E17.001; 455/509, 226.1, 226.2, 552
See application file for complete search history.

(56) References Cited

U.S. PATENT DOCUMENTS

| | | | |
|---|---|---|---|
| 7,424,268 B2 * | 9/2008 | Diener et al. ................ | 455/62 |
| 7,447,276 B1 * | 11/2008 | Beadle ......................... | 375/316 |
| 8,032,086 B2 * | 10/2011 | Waltho et al. ............... | 455/63.1 |
| 2004/0028003 A1 * | 2/2004 | Diener et al. ................ | 370/319 |
| 2004/0047324 A1 * | 3/2004 | Diener ......................... | 370/338 |
| 2006/0067354 A1 * | 3/2006 | Waltho et al. ............... | 370/433 |
| 2008/0165680 A1 | 7/2008 | Chang | |
| 2008/0198948 A1 | 8/2008 | Tang | |
| 2008/0207136 A1 * | 8/2008 | Tang et al. ................... | 455/73 |
| 2008/0207248 A1 * | 8/2008 | Tang ............................ | 455/522 |
| 2008/0233946 A1 | 9/2008 | Henry | |
| 2008/0291985 A1 * | 11/2008 | Adnani et al. ............... | 375/220 |
| 2008/0293353 A1 | 11/2008 | Mody et al. | |
| 2008/0317062 A1 * | 12/2008 | Timmers et al. ............. | 370/462 |
| 2009/0102981 A1 | 4/2009 | Mody et al. | |
| 2009/0124208 A1 * | 5/2009 | Mody et al. ................. | 455/67.11 |
| 2009/0135969 A1 * | 5/2009 | Corke et al. .................. | 375/345 |
| 2009/0143019 A1 | 6/2009 | Shellhammer | |
| 2009/0196180 A1 * | 8/2009 | Bahl et al. .................... | 370/235 |
| 2009/0197550 A1 * | 8/2009 | Huttunen et al. ............ | 455/161.1 |
| 2009/0197627 A1 * | 8/2009 | Kuffner et al. ............... | 455/522 |
| 2010/0134699 A1 * | 6/2010 | Gao et al. ..................... | 348/731 |
| 2010/0205234 A1 * | 8/2010 | Lim et al. ..................... | 708/205 |
| 2011/0021167 A1 * | 1/2011 | Shellhammer ............... | 455/226.1 |
| 2011/0217944 A1 * | 9/2011 | Tang ............................ | 455/226.2 |
| 2011/0279736 A1 * | 11/2011 | Tang et al. ................... | 348/731 |
| 2012/0057030 A1 * | 3/2012 | Ghosh et al. ................. | 348/192 |

(Continued)

FOREIGN PATENT DOCUMENTS

WO 2008114216 9/2008

OTHER PUBLICATIONS

Evaluation of the Performance of Prototype TV-Band White Space Devices Phase II, Steven K. Jones, Thomas W. Phillips, Hugh L. Van Tuyl, Robert D. Weller, FCC/OET 08-TR-1005, Office of Engineering and Technology of Federal Communications Commission.*

(Continued)

*Primary Examiner* — Jefferey Harold
*Assistant Examiner* — Sam Huang
(74) *Attorney, Agent, or Firm* — Procopio, Cory, Hargreaves & Savitch LLP

(57) ABSTRACT

A television band device has DTV pilot signal detection logic that generates DTV pilot signal detection decisions associated with a monitored television channel. A wireless microphone detection logic generates wireless microphone detection decisions associated with the monitored television channel. A sensing manager receives DTV pilot signal detection decisions and the wireless microphone detection decisions and analyzes at least one the respective decisions to determine whether the monitored television channel is available white space.

25 Claims, 9 Drawing Sheets

U.S. PATENT DOCUMENTS

2012/0142386 A1* 6/2012 Mody et al. .................. 455/509

OTHER PUBLICATIONS

"White-Space Sensing Device for Detecting Vacant Channels in TV Bands," Ser Wah Oh, Syed Naveen A. A., Yonghong Zeng, V.P. Kumar, T. P. C. Le, Karen J. M. Kua, and Weigiang Zhang, Institute for Infocomm Research, Jul. 14, 2008.*

International Search Report and Written Opinion issued on Mar. 29, 2011, in corresponding application No. PCT/CA2010/001818, 8 pages.

Jones, et al., "Evaluation of the Performance of Prototype TV-Band White Space Device Phase II, K.", Oct. 15, 2008, Technical Research Branch, Laboratory Division, Office of Engineering and Technology, Federal Communications Commision, pp. 1-8, 14, 19 and 111, 22 pages.

Oh, et al., "White Space Sensing Device for Detecting Vacant Channels in TV Bands", 6 pages.

Kim, et al., "A CR Platform for Applications in TV Whitespace Spectrum", 2008, 6 pages.

* cited by examiner

WHITE SPACE SPECTRUM SENSOR FOR TELEVISION BAND DEVICES

RELATED APPLICATIONS

This is the first application filed for this invention.

FIELD OF THE INVENTION

This invention relates in general to cognitive radio and, in particular, to an efficient spectrum sensor for television band devices that determines vacant bands (white spaces) within the VHF/UHF TV band spectrum.

BACKGROUND OF THE INVENTION

The opening of unused TV band spectrum for usage by unlicensed TV band devices has created a requirement for a television band device that can dynamically identify white spaces within the VHF/UHF TV band spectrum.

There therefore exists a need for a television band device with an efficient sensor for identifying white spaces within the VHF/UHF TV band spectrum.

SUMMARY OF THE INVENTION

It is therefore an object of the invention to provide a television band device with an efficient sensor for identifying white spaces within the VHF/UHF TV band spectrum.

The invention therefore provides a television band device, comprising: DTV pilot signal detection logic that searches for a DTV pilot signal in a smoothed power spectrum derived from a television channel signal frequency translated to a television channel signal centered at an intermediate frequency and generates DTV pilot signal detection decisions associated with the monitored television channel; wireless microphone detection logic that searches for wireless microphone or narrowband signals in the smoothed power spectrum and generates wireless microphone detection decisions associated with the monitored television channel; and a sensing manager that receives the DTV pilot signal detection decisions and the wireless microphone detection decisions and analyzes at least one the respective decisions to determine whether the monitored television channel is available white space.

The invention further provides a television band white space sensor, comprising: a first down converter circuit that digitizes and down converts a radio frequency front end output television channel signal to a television channel signal centered at an intermediate frequency; a Fast Fourier Transform that receives the television channel signal centered at the intermediate frequency and transforms it to a complex serial output signal; a spectral smoothing filter that averages the complex serial output signal to compute a smoothed power spectrum in serial mode; DTV pilot signal detection logic that receives the smoothed power spectrum, searches the smoothed power spectrum for a DTV pilot signal and outputs DTV pilot signal detection decisions; wireless microphone detection logic that receives the smoothed power spectrum, searches the smoothed power spectrum for a wireless microphone or other narrowband signal and outputs wireless microphone detection decisions; and a sensing manager that receives the respective detection decisions from the DTV pilot signal detection logic and the wireless microphone detection logic and analyzes at least one of the respective detection decisions to determine whether the radio frequency front end is tuned to a white space television channel.

The invention yet further provides a method of sensing a white space in a television band, comprising: selecting a television channel to sense; scanning a television channel signal frequency translated to a signal centered at an intermediate frequency to detect a DTV pilot signal; if a DTV pilot signal is detected, selecting a next television signal to sense; else, for a predetermined period of time repeatedly selecting the television channel and scanning the signal centered at the intermediate frequency to detect a wireless microphone or other narrowband signal; and if the wireless microphone or other narrowband signal is not detected at least a predetermined number of times during the predetermined period of time, confirming the selected television channel to be white space.

The invention still further provides a method of sensing a white space in a television band, comprising: tuning a radio frequency front end to a frequency associated with a television channel in the television band; converting output from the radio frequency front end to a signal centered at an intermediate frequency; scanning the signal centered at the intermediate frequency to detect a DTV pilot signal; if a DTV pilot signal is detected, tuning the radio frequency front end to a frequency associated with another television channel in the television band; else, scanning the signal centered at the intermediate frequency for a wireless microphone or other narrowband signal; and, for a predetermined period of time repeatedly tuning the radio frequency front end to the frequency associated with the television channel and scanning the signal centered at the intermediate frequency to detect the wireless microphone or other narrowband signal; and if a wireless microphone or other narrowband signal is detected, tuning the radio frequency front end to a frequency associated with another television channel in the television band.

BRIEF DESCRIPTION OF THE DRAWINGS

Having thus generally described the nature of the invention, reference will now be made to the accompanying drawings, in which.

DETAILED DESCRIPTION OF THE PREFERRED EMBODIMENTS

The invention provides a television band device and white space sensor, having DTV field sync detection logic that searches for a DTV field sync sequence in a baseband signal derived from a monitored television channel and generates DTV field sync detection decisions associated with the monitored television channel, DTV pilot signal detection logic that searches for a DTV pilot signal in a smoothed power spectrum derived from a television channel signal centered at an intermediate frequency and generates DTV pilot signal detection decisions associated with the monitored television channel, wireless microphone detection logic that searches for wireless microphone or narrowband signals in a smoothed power spectrum derived from the signal centered at the intermediate frequency and generates wireless microphone detection decisions associated with the monitored television channel, and, a sensing manager that receives the DTV field sync decisions, the DTV pilot signal detection decisions and the wireless microphone detection decisions and analyzes the respective decisions to determine whether the monitored television channel is available white space.

Figure 1:
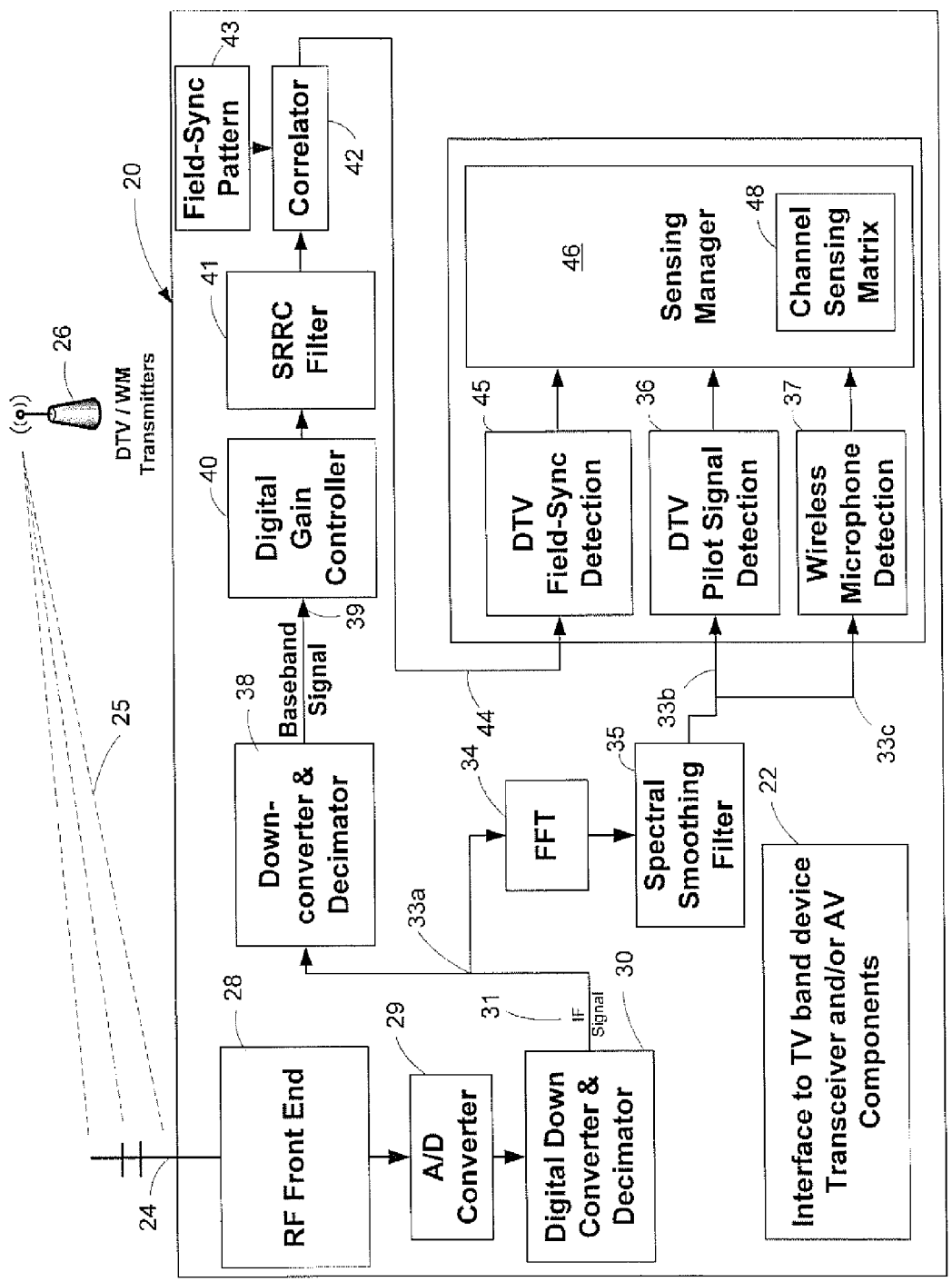
FIG. 1 is a schematic diagram of a television band device provisioned with a sensor for identifying television band white spaces in accordance with the invention.

FIG. 1 is a schematic diagram of a television band device 20 provisioned with a TV white space sensor in accordance with the invention. As will be understood by those skilled in the art, the television band device 20 has an interface 22 to its transceiver and/or audio/video (AV) components, which are well known in the art and are not shown or described. As further understood by those skilled in the art, the sensor components shown in FIG. 1 and described below may also be used for other receiver and/or signal processing functions in addition to the white space sensing performed by the television band device 20. It should further be understood by those skilled in the art that the white space sensing performed by the television band device 20 described below is performed in accordance with the provisions of the Advanced Television Systems Committee (ATSC) standard A/53 (ATSC Digital Television Standard, Parts 1-6, 2007). However, the methods described below can be adapted to other international television standards without departing from the scope of the invention.

The television band device 20 is equipped with a television band antenna 24, the structure and function of which is well known in the art. The antenna 24 receives television band signals 25 transmitted by Digital Television (DTV) and/or wireless microphone (WM) transmitters 26. As is well understood by those skilled in the art, the television band signals 25 received by the antenna 24 are contaminated with additive Gaussian white noise (AWGN) and multipath duplications of the transmitted signals. The received signals are passed from the antenna 24 to at least one radio frequency (RF) front end 28 that is designed to selectively segregate one television band channel at a time from the received signals. The at least one RF front end 28, hereinafter referred to simply as the "RF front end 28" outputs a gain adjusted analog intermediate frequency signal derived from the selected channel signal.

The analog intermediate frequency signal output by the RF front end 28 is passed to an analog-to-digital (A/D) converter 29 which samples the RF front end 28 output at a sampling rate of, for example, 100 MHz (about eight times the ATSC symbol rate) to convert the analog intermediate frequency to a digital signal. The digital signal is passed to a digital down converter and decimator 30, which down samples and decimates the digital signal and outputs a signal centered at an intermediate frequency (IF), hereinafter referred to simply as the IF signal 31. In accordance with one embodiment of the invention, the IF signal 31 is centered at 5.381 MHz. The IF signal 31 is simultaneously passed via signal path 33a to an FFT 34 and a down-converter and decimator 38. The FFT 34 processes the IF signal 31 in accordance with parameters that will be explained below with reference to FIG. 4 and outputs a serial data stream to a spectral smoothing filter 35, which will also be described below with reference to FIG. 4. The serial output of the spectral smoothing filter is output via a signal path 33b to DTV pilot signal detection logic 36 and via signal path 33c to wireless microphone detection logic 37. Meanwhile, the down-converter and decimator 38 outputs a baseband signal 39 in a manner well known in the art. The baseband signal 39 is passed to a digital gain controller 40, which automatically adjusts the gain of the baseband signal 39 and outputs the gain-adjusted baseband signal to a square root raised cosine filter and equalizer (SRRC filter) 41, the functioning of which is known in the art. The output of the SRRC filter 41 is passed to a correlator 42, which correlates the SRRC filter output with a stored ATSC field-sync pattern 43. Output from the correlator 42 is passed via signal path 44 to DTV field-sync detection logic 45, the function of which will be explained below with reference to FIG. 5.

Outputs from the DTV pilot signal detection logic 36, the wireless microphone detection logic 37 and the DTV field-sync detection logic 45 are respectively passed to a sensing manager 46. The sensing manager 46 maintains a channel sensing matrix 48 and makes all final decisions about the detection of a white space TV band channel, as will be described below with reference to FIGS. 2, 5, 8 and 9.

Figure 2:
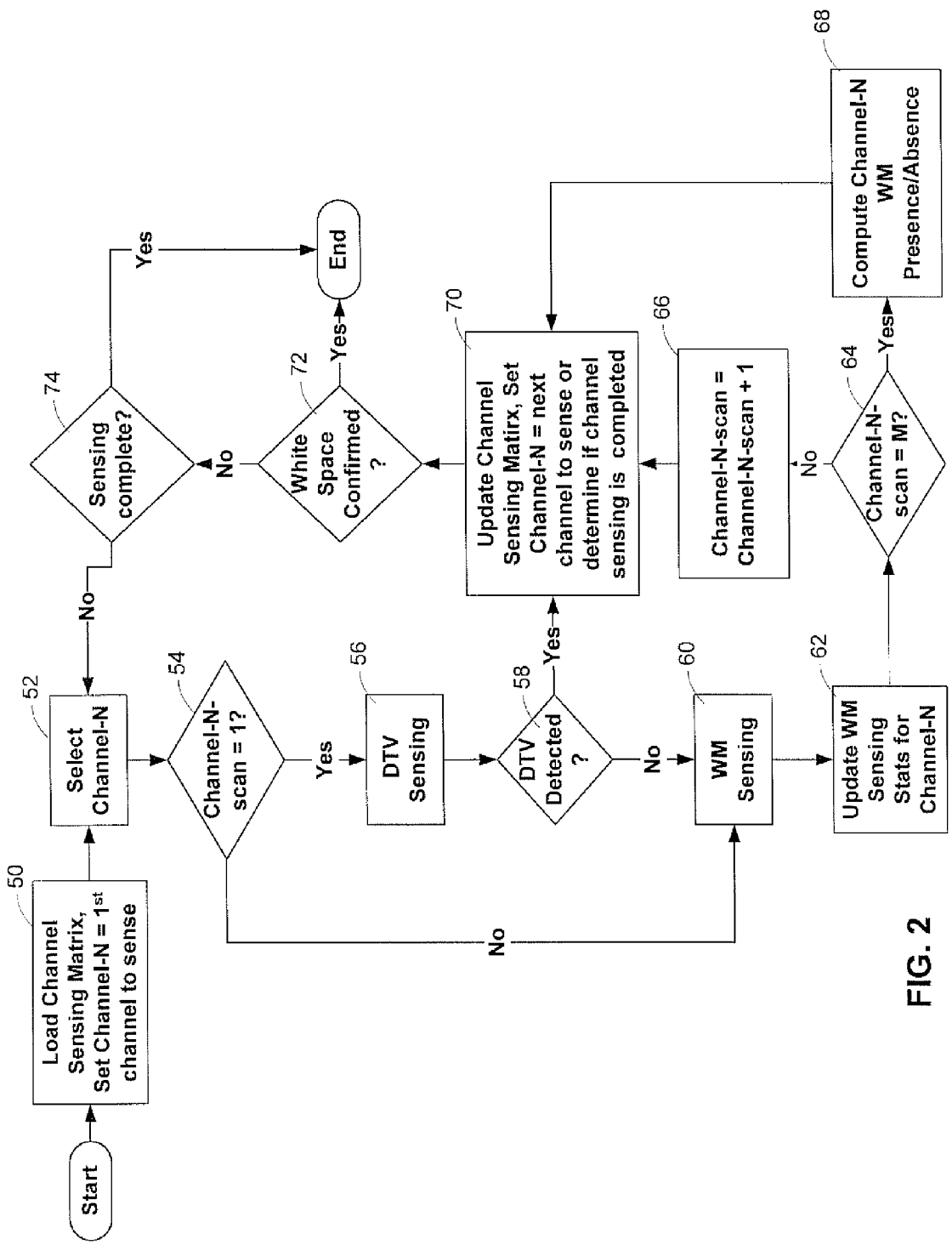
FIG. 2 is a flow chart of an overview of one embodiment of a sensing procedure used by the sensor shown in FIG. 1.

FIG. 2 is a flow chart of one embodiment of a sensing procedure used by the sensor of the television band device 20 shown in FIG. 1. The sensing manager 46 loads and initializes (50) the channel sensing matrix 48 by setting or resetting the channel sensing matrix 48 to predetermined default values. The content and structure of the channel sensing matrix 48 are a matter of design choice. However, the channel sensing matrix contains or is initialized to contain a list of channels to be sensed for white space. That list may include all 49 known potential white space channels in the UHF/VHF television bands, or may exclude all channels in a given area that have been licensed for DTV or WM use. In accordance with one embodiment of the invention, a query (not shown) to a database of locally licensed channels in the UHF/VHF television bands is performed to initialize the list of channels in the channel sensing matrix 48 to be sensed. After the channel sensing matrix has been loaded and initialized, a variable "Channel-N" is set to the first channel to be sensed. Channel-N may be selected using any appropriate algorithm, such as the first channel in an ascending numerical order of the channels to be sensed; a first channel in a descending numerical order of the channels to be sensed; a channel last confirmed to be white space; etc. In the examples described below, Channel-N is first set to the first channel in the ascending numerical order of the channels to be sensed.

Figure 6:
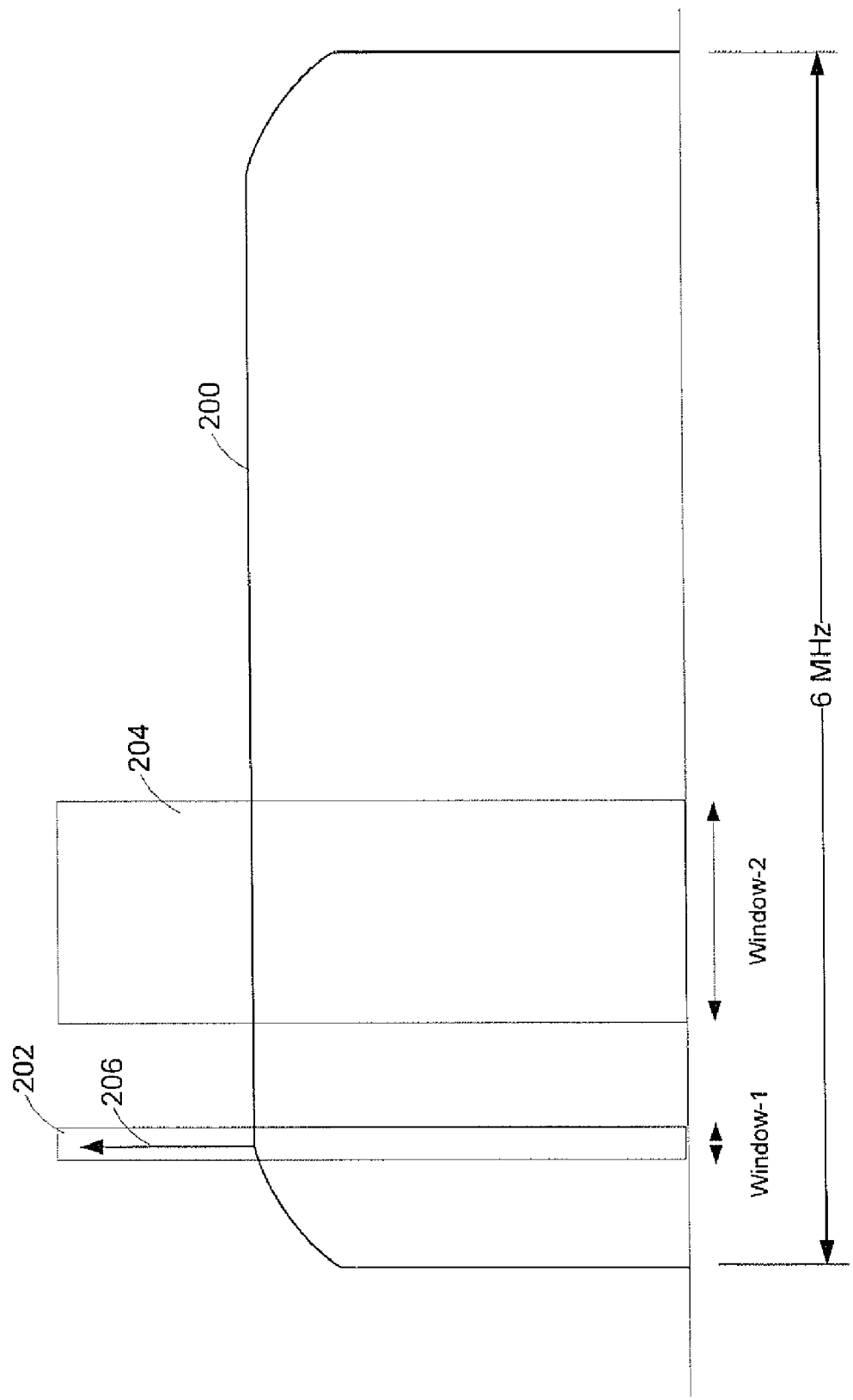
FIG. 6 is a schematic diagram of ATSC Pilot sensing windows used by the sensor shown in FIG. 1.
Figure 7:
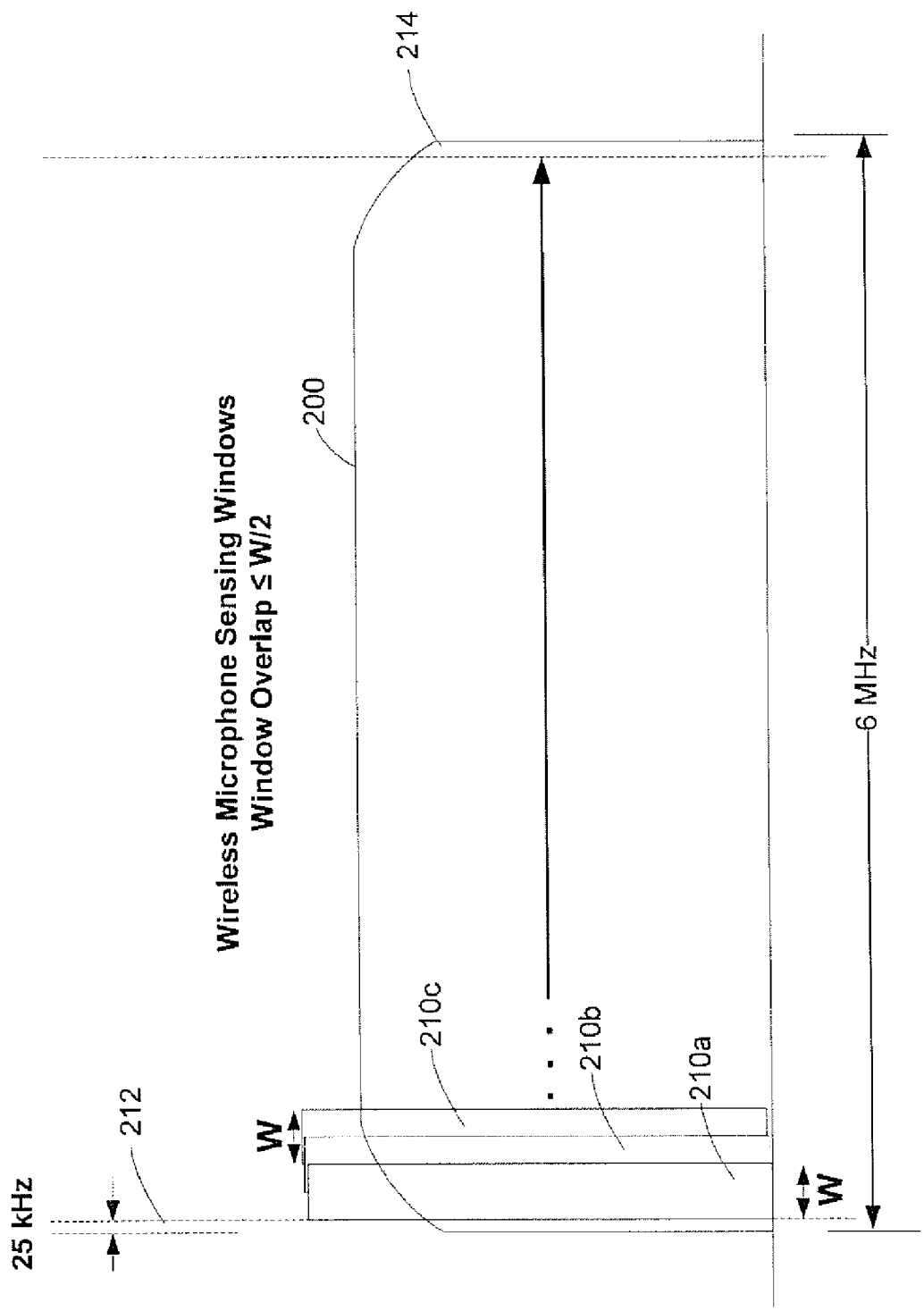
FIG. 7 is a schematic diagram of wireless microphone and other narrowband signal sensing windows used by the sensor shown in FIG. 1.

After the channel sensing matrix 48 is loaded, the RF front end 28 is instructed by the sensing manager 46 to select Channel-N (52). The sensing manager then determines (54) whether a variable "Channel-N-scan" is equal to "1". The variable Channel-N-scan is set to "1" for each channel to be scanned when the channel sensing matrix 48 is initialized. If Channel-N-scan=1, this is the first scan of Channel-N and DTV sensing (56) is performed, as will be explained below with reference to FIGS. 5 and 6. In all subsequent scans, only wireless microphone (WM) sensing is performed, which will be explained below with reference to FIGS. 7 and 8. The sensing manager 46 then determines (58) if a DTV signal has been detected. If a DTV signal was not detected or Channel-N-scan was not equal to "1" then WM sensing (60) is performed and wireless microphone statistics for Channel-N in the channel sensing matrix 48 are updated (62). The sensing manager 46 then determines (64) whether Channel-N-scan is equal to a variable M. In one embodiment the variable M is 29 which, given the scanning interval and an average number of channels to scan, is the number of scans that can performed in 30 seconds, the Federal Communications Commission (FCC) regulated time interval to verify white space. However, the value of M may also be dynamically assigned, depending on the number of channels to be scanned, and/or total elapsed time since a beginning of the scanning procedure when the first scan of all channels to be scanned has been completed.

If Channel-N-scan is not equal to h, the sensing manager 46 increments Channel-N-scan (66). However, if Channel-N-scan is equal to M the scanning of Channel-N is complete and the sensing manager 46 makes a decision (68) about whether a wireless microphone signal or other narrowband signal has been confirmed while scanning Channel-N, as will be described below with reference to FIGS. 8 and 9. In either event, the channel sensing matrix is updated (70) with the information about Channel-N. The variable Channel-N is then either set to the next channel to be sensed, or the sensing manager 46 determines that the sensing of all channels has been completed. The sensing manager 46 subsequently examines the channel sensing matrix to determine (72) whether a white space channel has been confirmed. A white space channel is confirmed if it is determined that a DTV signal was not detected on that channel, and that after a total elapsed time of at least 30 seconds (FCC-08-260), no wireless microphone or other narrowband signals were confirmed, as will be explained below with reference to FIG. 9, after all of the M scans of that channel have been completed. If a white space channel is confirmed at (72), the scanning process ends. Otherwise, the sensing manager 46 determines (74) whether channel sensing is completed. If channel sensing is not completed, the sensing manager 46 instructs the RF front end 28 to select Channel-N (52) and the process described above is repeated until a white space channel is confirmed or the sensing of all channels in the channel sensing matrix 48 is completed.

Figure 3:
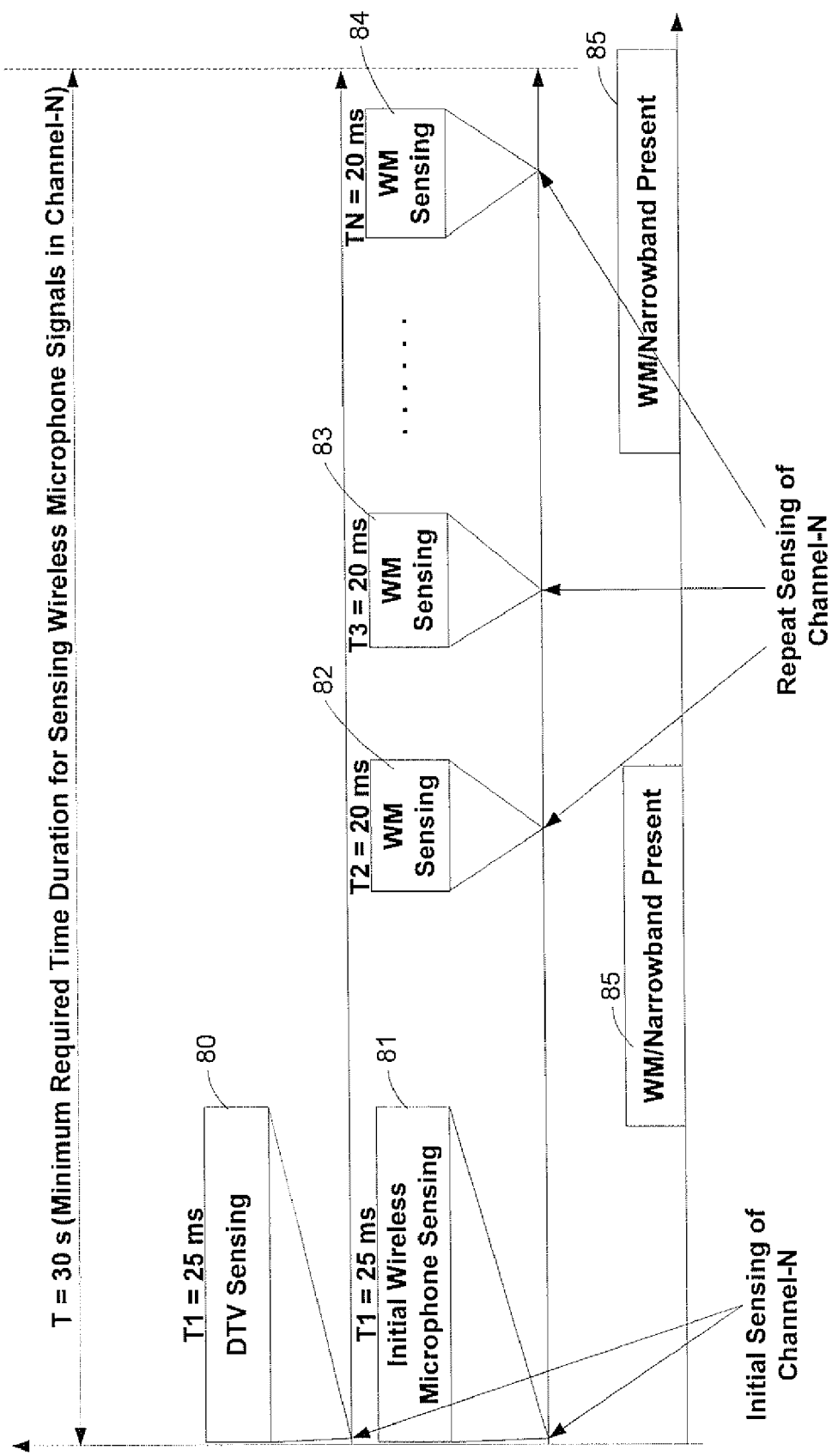
FIG. 3 is a schematic diagram of a timing chart showing one embodiment of a sensing schedule used by the sensor shown in FIG. 1.

FIG. 3 is a schematic diagram of a timing chart showing one embodiment of a sensing schedule used by the sensor of the television band device 20 shown in FIG. 1. As explained above, the FCC dictates that any potential white space channel must be monitored for a minimum of 30 seconds to ensure that no wireless microphone or other narrow band signals are present on that channel. As understood by those skilled in the art, a channel used by a DTV broadcaster is normally always on. Consequently, a DTV signal is generally readily detected and can be conclusively identified within about 25 ms, the time required to complete an initial scan of a television band channel in accordance with the embodiment of the invention described below with reference to FIGS. 4-9. As explained above with reference to FIG. 1, DTV sensing 80 and initial WM sensing 81 are preformed in parallel. Consequently, the initial scan of each channel in the channel sensing matrix 48 is completed in about 25 ms. Subsequent scans 82-84 of the same channel are spaced apart in time as described above with reference to FIG. 2, and are assumed to detect at least one occurrence of the WM or other narrowband signal 85 if the channel is in use by a wireless television band device within range of the sensor in accordance with the invention.

Figure 4:
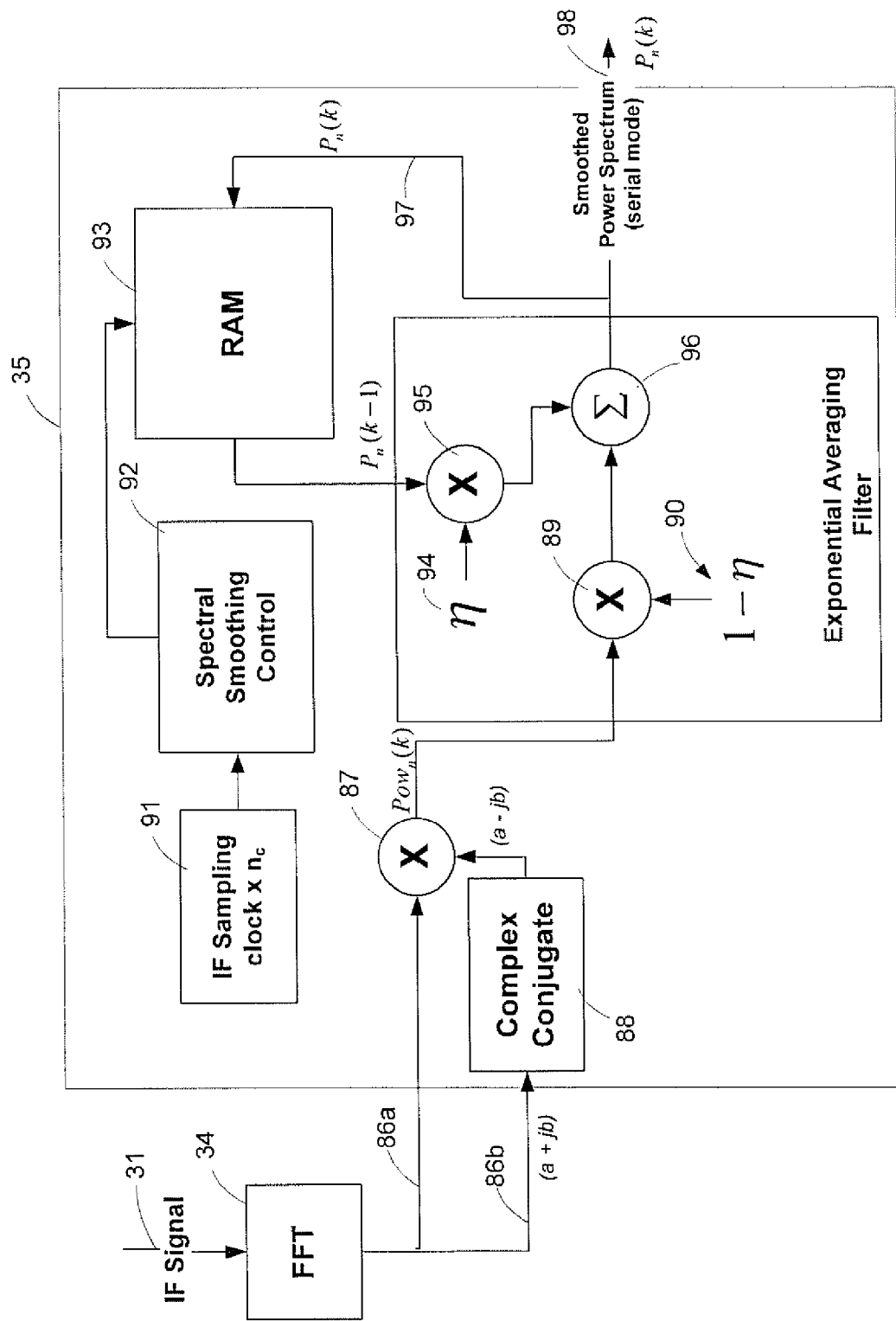
FIG. 4 is a schematic diagram of one embodiment of a spectral smoothing mechanism in accordance with the invention.

FIG. 4 is a schematic diagram of one embodiment of the spectral smoothing filter 35 shown in FIG. 1. When the antenna 24 (FIG. 1) receives a television band channel selected by the RF front end 28 under the direction of the sensing manager 46, the analog-to-digital converter 29 samples the received signal at a predetermined rate $f_s$. In accordance with one embodiment of the invention, $f_s$ equals 100 MHz, or about eight times the ATSC symbol rate, which is down converted and decimated to the IF signal 31 by the digital down converter and decimator 30 as explained above with reference to FIG. 1. The IF signal 31 is sampled by the FFT 34 at a predetermined sampling rate. In accordance with one embodiment of the invention, the FFT sampling rate is 21.524 MHz. The FFT 34 has a programmable size of up to 4096 (4K). In one embodiment of the invention, the FFT 34 is programmed to have 4K bins. The FFT 34 converts the serial IF signal 31 to a parallel signal that is processed by a Fast Fourier Transform in a manner well known in the art and converted back to a serial data stream that is output over parallel signal paths 86a, 86b to the spectral smoothing filter 35. The signal path 86a provides the complex serial FFT output data to a multiplier function 87 that holds each bin value, (a+jb) in which "j" is the imaginary component, until a complex conjugate function 88 processes the complex signal and outputs the conjugate (a−jb) of the of the complex signal. The multiplier function 88 multiplies the complex FFT output signal by its complex conjugate (a+jb) (a−jb), which removes the imaginary component and outputs a signal power ($Pow_n(k)$, where n=1, 2, ..., 2048), for the first half of the FFT bins. The signal power values are output to an exponential averaging filter, which in this embodiment includes a multiplier function 89 that receives the serial $Pow_n(k)$ values and multiplies each value by a programmable constant 1−η. In one embodiment, η is set to 0.95. Concurrently, a timing circuit 91 outputs a timing signal at a rate of the FFT sampling clock times $n_c$, i.e. 21.524 MHz*$n_c$, where $n_c \geq 2$. The timing signals output by the timing circuit 91 are fed to a spectral smoothing control function 92 that controls read and write operations of a random access memory (RAM) 93. In one embodiment, a depth of the RAM 93 used by the spectral smoothing control function is the FFT bin size ($N_{FFT}$)/2, i.e. 4K/2=2K. Between samples of the IF signal 31, the spectral smoothing control function 92 reads a value from RAM 93 corresponding to the same FFT bin n in the previous (k−1) FFT cycle, i.e. $P_n(k-1)$, and outputs that value to a multiplier function 95, which multiplies the value $P_n(k-1)$ retrieved from RAM 93 by the programmable constant 94 (η). The output of the multiplier function 95 is passed to the summing function 96, which adds the outputs of the multiplier functions 89 and 95 to produce a smoothed power spectrum 98, $P_n(k)$. The smoothed power spectrum 98 value $P_n(k)$ is also routed via signal path 97 to the RAM 93, where the spectral smoothing control function 92 uses it to overwrite the value $P_n(k-1)$ just read the RAM 93. Expressed mathematically, the spectral smoothing filter 35 computes $P_n(k)$ as:

$$P_n(k) = \eta \times P_n(k-1) + (1-\eta) \times Pow_n(k) \qquad \text{eq. 1}$$

where: n=1, 2, ... $N_{FFT}$/2; and k=1, 2, ..., $N_{av}$ $N_{av}$ is a programmable variable that triggers certain events. As explained below with reference to FIG. 5, in one embodiment $N_{av}$ is set to 100.

Figure 5:
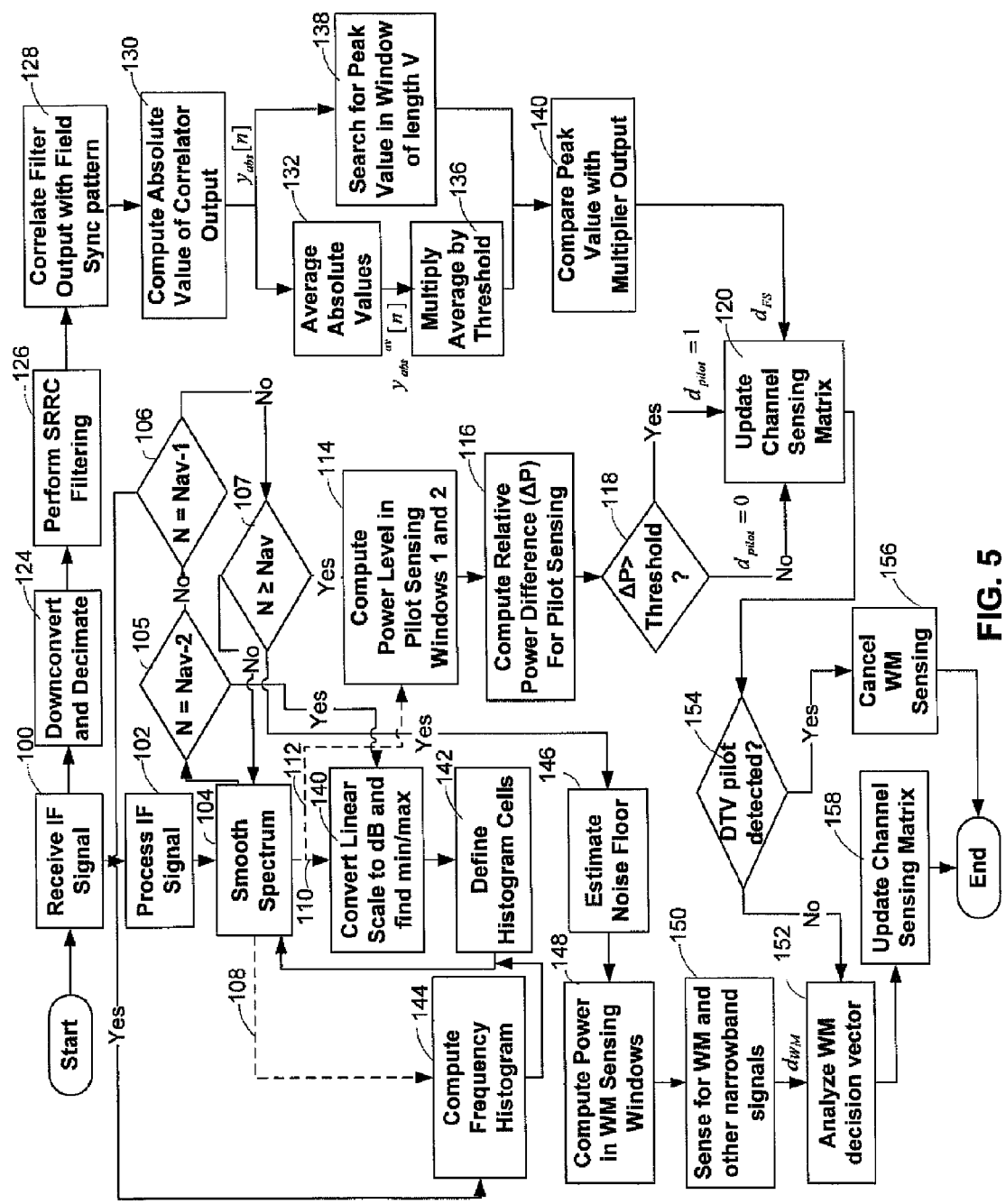
FIG. 5 is a flow chart of one embodiment of a sensing process used by the sensor shown in FIG. 1.

FIG. 5 is a flow chart of one embodiment of a sensing process used by the sensor of the television band device 20 shown in FIG. 1. As explained above with reference to FIG. 4, the IF signal 31 is received (100) and processed (102) by the FFT 34. The power spectrum output by the FFT 34 is averaged (104) by the spectral smoothing filter 35, which outputs the smoothed power spectrum $P_n(k)$. The smoothed power spectrum is continuously output to the wireless microphone detection logic 37 (108 and 110), and (112) to the DTV pilot signal detection logic 36, but that output is not processed until a predetermined number of FFT cycles have been averaged by the spectral smoothing filter 35, as will be explained below in more detail. Consequently, after each FFT output cycle it is determined (105) if a current number N of FFT cycles averaged by the spectral smoothing filter 35 is equal to $N_{av}$−2. If not, it is determined (106) if a current number N of FFT cycles averaged by the spectral smoothing filter 35 is equal to $N_{av}-1$. If not, it is determined (107) if a current number N of FFT cycles averaged by the spectral smoothing filter 35 is greater than or equal to $N_{av}$. If none of these conditions is true, the averaging of FFT cycle outputs is continued by the spectral smoothing filter 35, as explained above with reference to FIG. 4. When $N \geq N_{av}$, the DTV pilot signal detection logic 36 computes (114) a signal power level in a DTV pilot signal sensing window-1 and a window-2 using the $N^{th}$ average values $1, \ldots, N_{FFT}/2$ output from the spectral smoothing filter 95.

DTV pilot signal sensing window-1 (see 202 in FIG. 6), is a narrow window having a width in frequency of $\Delta f_1$ and FFT indices $[n_1, n_2]$. Window-1 is centered in the 6 MHz DTV signal 200 where the DTV pilot 206 (FIG. 6) is located. In one embodiment $\Delta f_1$ is about 30 KHz. The DTV pilot signal sensing window-2 (see 204 in FIG. 6) has a width in frequency of $\Delta f_2$ and FFT indices $[n_3, n_4]$. The DTV pilot sensing window-2 is located in the DTV data portion of the 6 MHz channel. In one embodiment, $\Delta f_2$ is about 1 MHz. The width in frequency and position of DTV pilot signal sensing window-2 is largely a matter of design choice, though it must not include bandwidth occupied by the pilot signal. The computed power ($P_{w1}$) in window-1 is a sum of the respective values of $P_n$ between FFT indices $n_1$ and $n_2$. The computed power ($P_{w2}$) in window-2 is a sum of the respective values of $P_n$ between FFT indices $n_3$ and $n_4$.

With reference once more to FIG. 5, after computing (114) the power level in pilot sensing window-1 and window-2, a relative power difference ($\Delta P$) is computed (116) by first scaling the power in window-2 and then computing the power difference between window-1 and window-2 using the equations:

$$P'_{W2} = P_{W2} \times \left(\frac{\Delta f_1}{\Delta f_2}\right); \text{ and} \qquad \text{eq. 2}$$

$$\Delta P = P_{W1} - P'_{W2} \qquad \text{eq. 3}$$

The power difference $\Delta P$ is then compared (118) with a programmable threshold to determine if the pilot signal has been detected. In one embodiment the programmable threshold is set to 0.5 dB. If $\Delta P$ is larger than the threshold, $d_{pilot}=1$ is passed to the sensing manager 46 to indicate that the DTV pilot has been detected. If $\Delta P$ is less than the threshold, $d_{pilot}=0$ is passed to the sensing manager 46 to indicate that the DTV pilot has not been detected. The sensing manager 46 updates (120) the channel matrix 48 as described above with reference to FIG. 2.

Concurrently, the IF signal 31 is further downconverted and decimated (124), SRRC filtered (126), and correlated with the field-sync pattern (128) as described above with reference to FIG. 1. In one embodiment, the field-sync pattern 43 is the PN511 section of the DTV field-sync pattern. In another embodiment, the field-sync pattern is extended to include the three PN63 sequences following the PN511 of the DTV field-sync pattern. The DTV field-sync detection logic 45 computes (130) an absolute value of the correlator output $y_{abs}[n]$, averages (132) each absolute value with the previous absolute value and multiplies the average by a programmable value ($\beta$) using the equation:

$$y_{abs}^{av}[n] = \beta \times y_{abs}^{av}[n-1] + (1-\beta) \times y_{abs}[n], \text{ where } \beta = 0.95 \qquad \text{eq. 4}$$

The computed averages are then multiplied (136) by a programmable threshold $\tau_{FS}$, and the product is compared (140) with a peak value found in a predefined window of length V as follows:

$$\underset{\substack{n \in \text{ window} \\ \text{length } V}}{\text{Max}} \text{ of}(y_{abs}[n]) \overset{d_{FS1}}{\underset{f_{VS0}}{\gtrless}} y_{abs}^{av} \times \tau_{FS}$$

In one embodiment, the threshold $\tau_{FS}=7$. The length of the predefined window V is a matter of design choice, but the window must be longer than the field-sync symbol sequence being matched. In one embodiment, the window V is 1,000 symbols long. The respective decisions $d_{FS1}$ (field-sync present) and $d_{FS0}$ (field-sync absent), one of which is output after each window V is processed, are passed to the sensing manager 46, which uses (120) the field-sync detection decisions to update the channel sensing matrix if both the DTV pilot detection decisions and the WM detection decisions indicate that the monitored channel is white space, as will be explained below in more detail with reference to FIG. 9.

In addition to pilot sensing and field-sync sensing for DTV signals, the mechanism in accordance with the invention concurrently performs sensing for WM and other narrowband signals after the spectrum smoothing filter 35 has averaged a predetermined number of FFT cycles. WM and narrowband sensing is performed using a sliding WM sensing window 210 shown in FIG. 7. For the sake of illustration, three instances of the sliding WM sensing window 210a-210c are shown. The sliding WM sensing windows 210 have a programmable width W. In one embodiment, the width W is 20 FFT bins (105.1 kHz), The initial position of the sliding WM sensing window 210 is at the upper edge of the 25 kHz guard interval 212 located at the lower edge of the 6 MHz channel. In one embodiment the sliding WM sensing window positions are overlapped by up to W/2. The WM sensing window 210 is moved across the 6 MHz band to the lower edge of the upper 25 kHz guard interval 214. The frequencies corresponding to the WM sensing window 210 positions are pre-computed. The window size (W in Hz) and the window overlap are used to calculate the lower edge frequency $f_1$ and upper edge frequency $f_2$ for each WM sensing window position. For a given window position, the FFT bin numbers ($n_1$, $n_2$) corresponding to $f_1$ and $f_2$ are pre-computed as follows:

$$W = N_b \times f_{res} \qquad \text{eq. 5}$$

Where: $N_b$ = number of FFT bins in Window W $$\text{and, } f_{res} = \frac{f_s}{N_{FFT}}$$

$$n_1 = \text{floor}\left(\left(\frac{f_s}{N_{FFT}}\right) \times f_1\right) \qquad \text{eq. 6}$$

$$n_2 = \text{floor}\left(\left(\frac{f_s}{N_{FFT}}\right) \times f_2\right) \qquad \text{eq. 7}$$

With reference once more to FIG. 5, after the spectral smoothing filter 35 has averaged $N_{av}-2$ FFT cycles as determined at (105), the smoothed power spectrum outputs are converted from linear scale to decibels (dB), as will be explained below with reference to FIG. 8, and a minimum and maximum power level are found (140). The minimum and maximum decibel levels are then used to define (142) a predefined number of histogram cells, as will also be explained below with reference to FIG. 8. The process then returns to spectrum smoothing (104).

When it is determined (106) that the spectral smoothing filter 35 has computed $N_{av}-1$ averages, the histogram cells defined at (142) are used to compute a frequency histogram (144), as will also be explained below with reference to FIG. 8. After the frequency histogram is computed, the process returns to the spectral smoothing function 104 and another cycle of FFT outputs is processed.

When it is determined (107) that the spectral smoothing filter 35 has averaged $N_{av}$ FFT cycles, the frequency histogram computed at 144 is used to estimate a power spectrum noise floor (146), as will be explained below with reference to FIG. 8. The wireless microphone detection logic 37 then computes (148) a power level in each WM sensing window 210 as follows:

$$P_{w1} = \left(\sum_{n=n_1}^{n_2} \frac{P_n}{f_{res}}\right) \times f_{res} = \sum_{n=n_1}^{n_2} P_n \quad \text{eq. 8}$$

The computed power levels are compared with the estimated noise floor to sense (150) for WM and other narrowband signals. The WM detection logic 37 outputs a decision vector $d_{WM}$, which is analyzed (152) by the sensing manager 46 if the update (120) of the channel sensing matrix 48 indicates that a DTV pilot signal was not detected, as determined at (154). If a DTV pilot signal has been detected, WM sensing is cancelled (156) and the process ends. Otherwise, the WM decision vector is analyzed by the sensing manager 46, as will be explained below with reference to FIG. 9, and the sensing manager 46 updates (158) the channel sensing matrix 48.

Figure 8:
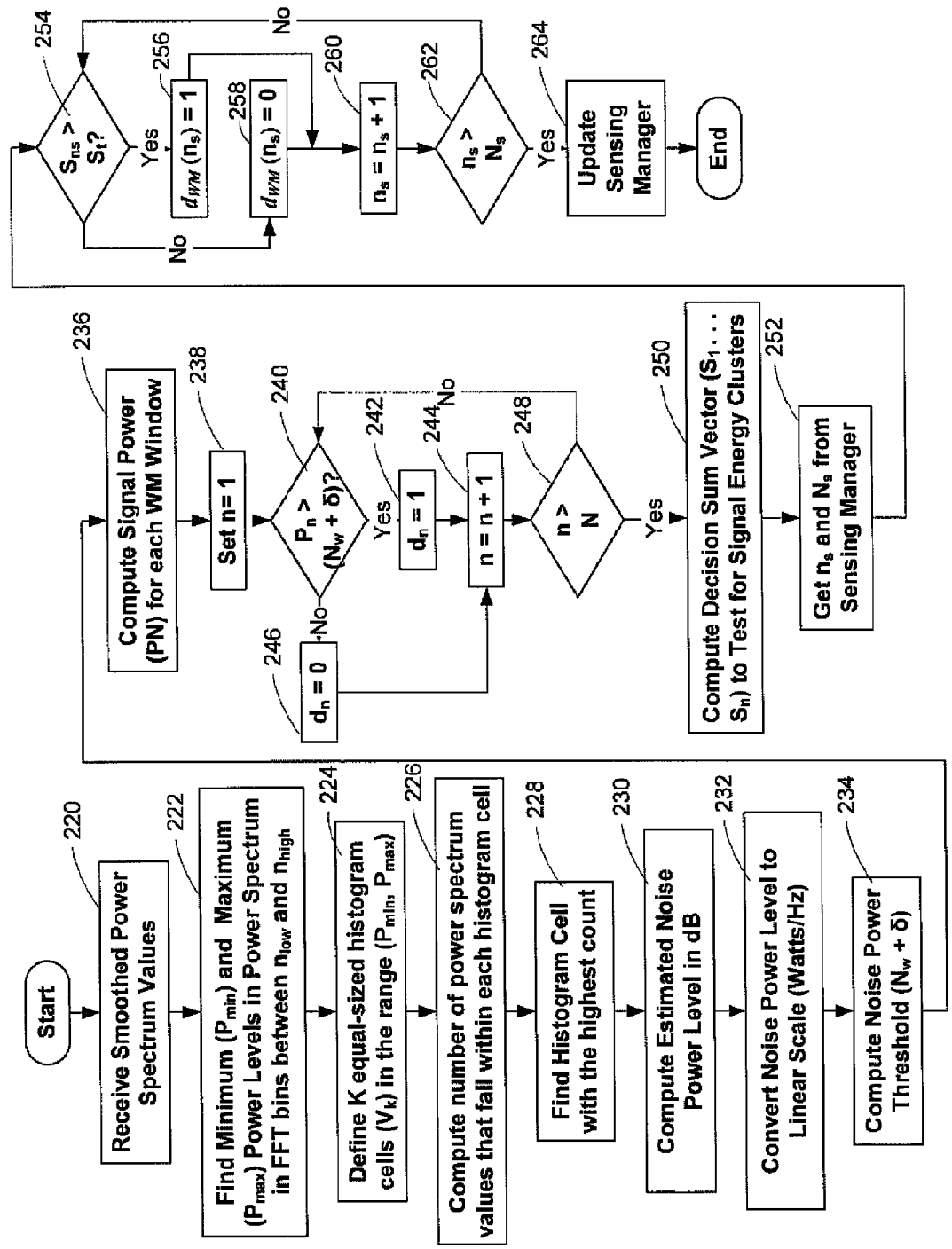
FIG. 8 is a flow chart of one embodiment of a process used by the sensor shown in FIG. 1 to sense wireless microphone and other narrowband device signals.

FIG. 8 is a flow chart of one embodiment of a process used by the sensor of the TV band device 20 shown in FIG. 1. to sense wireless microphone and other narrowband device signals, as described in overview with reference to FIG. 5. As explained above, the smoothed power spectrum values are received (220) by the WM detection logic 37 and converted from the linear scale (x) to dB (y) as follows:

$$y = 10 \times \log 10(x) \quad \text{eq. 9}$$

Following that the WM detection logic 37 finds (222) a lowest power level ($P_{min}$) and a highest power level ($P_{max}$) in the smoothed power spectrum of channel bandwidth=BW covered by FFT indices ($n_{low}$, $n_{high}$) as follows:

$$f_{low} = f_W - \left(\frac{BW}{2}\right) \quad \text{eq. 10}$$

$$f_{high} = f_{IF} + \left(\frac{BW}{2}\right) \quad \text{eq. 11}$$

$$n_{low} = \text{floor}\left(\left(\frac{f_s}{N_{FFT}}\right) \times f_{low}\right) \quad \text{eq. 12}$$

$$n_{high} = \text{ceil}\left(\left(\frac{f_s}{N_{FFT}}\right) \times f_{high}\right) \quad \text{eq. 13}$$

K equally-sized histogram cells ($V_k$) are then defined (224) within the range of ($P_{min}$, $P_{max}$) as follows:

$$V_k = P_{min} + (k-1) \times \left(\frac{P_{max} - P_{min}}{K}\right), k = 1, \ldots, K \quad \text{eq. 14}$$

The variable K is programmable. In one embodiment, K is equal to 64.

The frequency histogram is then computed (226) as follows:

$h_k$=Number of Power spectrum values falling between $$V_k \leq 10 \times \log 10(P_n) < V_{k+1}, \text{ for } k=1, \ldots, K-1$$

$$n_{low} \leq n \leq n_{high}$$

The WM detection logic then finds (228) the histogram cell with the highest frequency count as follows:

$$k^{max} = \max_{k}(h_k, k = 1, \ldots, K-1) \quad \text{eq. 15}$$

The estimated noise power level ($N_p$) in dB is then computed (230) as follows:

$$N_p = \left(\frac{V_{k^{max}} + V_{k^{max}+1}}{2}\right) dB \quad \text{eq. 16}$$

The noise power level ($N_p$) is then converted (232) to linear scale ($N_0$) (Watts/Hz), as follows:

$$N_0 = 10^{\left(\frac{N_p}{10}\right)} \times \left(\frac{1}{f_{res}}\right) \text{Watts/Hz} \quad \text{eq. 17}$$

A noise power ($N_W$) in each sliding window is computed as follows:

$$N_W = N_0 \times W = N_0 \times N_b \times f_{res} \quad \text{eq. 18}$$

Where: W is the sliding window width in Hz.

A noise power threshold is then computed (234) as follows:

$$\text{threshold} = N_W + \delta \quad \text{eq. 19}$$

Where: δ is a programmable constant.

In one embodiment, δ is equal to 0.1. The signal power (PN, where N equals the number of sliding windows 210) is then computed (236) for each sliding window using equation 8 as described above with reference to FIG. 5. A loop counter n is set to 1 (238) and it is determined whether the computed signal power $P_n$ in window n is greater than the computed noise power threshold (eq. 19). If so, WM decision vector member $d_n$ is set to "1" (242). If not, $d_n$ is set to "0" (246). In either event, n is incremented by 1 (244) and it is determined if n is greater than N. If not, the loop (240-248) is executed again until a WM decision $d_n$ has been generated for each of the windows 210.

After all of the WM decisions $d_n$ have been generated, a decision sum vector $S_n$ is computed (250) to test for localized signal energy clusters, which are indicative of the presence of a wireless microphone or other narrowband signal, as follows:

```
Running_sum = 0;
for n = 1:N
    If d_n == 1
        Running_sum = Running_sum +1;
    else
        Running_sum = 0;
    end;
    sum_vector(n) = Running_sum;
End;
```

The wireless microphone detection logic 37 then gets (252) a loop counter start value $n_s$ and a loop counter end value $N_s$ from the sensing manager 46. If a strong DTV signal has been detected in a neighboring channel(s), the start value and/or the end value may be adjusted to eliminate false detections due to signal energy clusters that may be detected near the adjacent channel edge(s) as a result of signal bleed into the edges of the channel being sensed. The wireless microphone detection logic 37 also zeroes all occurrences of a wireless microphone decision vector $d_{wm}$.

The wireless microphone detection logic 37 then determines (254) whether the sum_vector value $S_{ns}$ is greater than a programmable threshold $S_t$. In one embodiment of the invention, $S_t$ is equal to 3. If so, the wireless microphone decision vector $d_{wm}$ is set (256) to equal 1. If not, the wireless microphone decision vector $d_{wm}$ is set (258) to zero. The loop counter start value $n_s$ is then incremented (262) by 1 and it is determined (264) whether the loop counter $n_s$ is greater than the loop counter end value $N_s$. When all of the sum_vector values within the range of $n_s$–$N_s$ have been tested, the wireless microphone decision vector $d_{wm}$ is passed (246) to the sensing manager 46, and the process ends.

Figure 9:
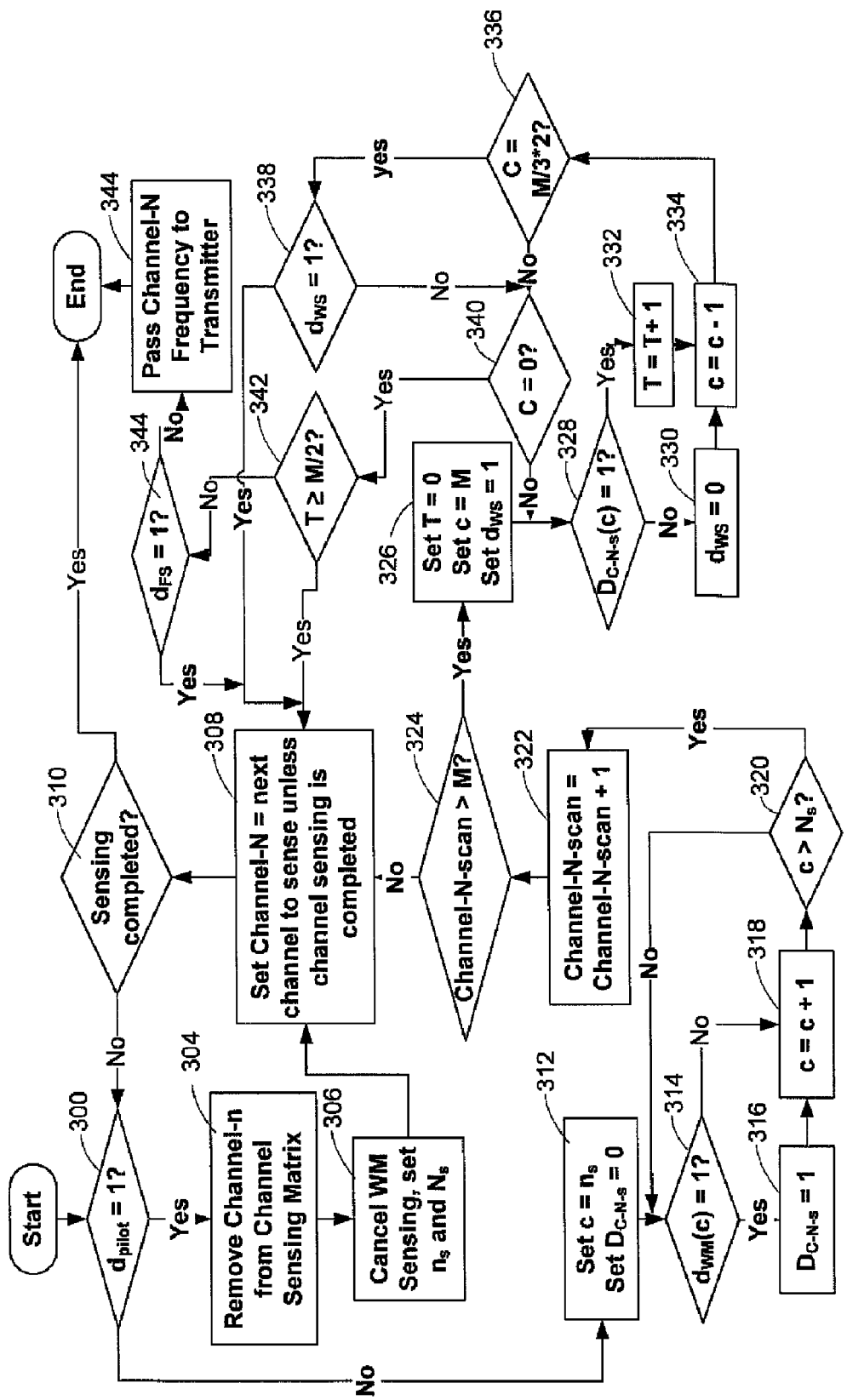
FIG. 9 is a flow chart of one embodiment of a decision making process used by the sensing manager shown in FIG. 1 to determine whether a white space channel for use by the television band device has been detected.

FIG. 9 is a flow chart of one embodiment of a decision making process used by the sensing manager 46 shown in FIG. 1 to determine whether a white space channel for use by the television band device 20 has been detected. The sensing manager 46 receives (300) the pilot signal decision $d_{pilot}$ from the DTV pilot signal detection logic 36, as explained above with reference to FIG. 5. If the pilot signal decision indicates that a DTV pilot signal was detected ($d_{pilot}=1$), a DTV signal is confirmed and the channel being scanned (Channel-N) is removed (304) from the channel sensing matrix 48, or otherwise indicated to be in use. It should be noted that in accordance with another embodiment of the invention, a DTV signal is confirmed when both the pilot signal and the field sync pattern are detected.

In either embodiment, when a DTV signal is confirmed the sensing manager 46 cancels (306) the WM detection process or ignores output decisions from the WM detection logic 37. In accordance with one embodiment of the invention, the sensing manager 46 uses the computed power in the WM sensing windows (see 140, FIG. 5) to determine a strength of the DTV signal. The sensing manager then sets the WM screening variables $n_s$ for channel-n+1 and $N_s$ for channel-N–1 which respectively define a bottom edge and a top edge of the WM sensing spectrum for adjacent channels, as explained above with reference to FIG. 8, and stores those values for later use. The sensing manager 46 then sets (308) Channel-N to the next channel in the channel sensing matrix to be sensed unless all channel sensing is completed. If all channel sensing is completed (310), the process ends. Otherwise, the sensing manager waits for the next pilot signal decision (300), and the process repeats.

If the sensing manager 46 determines (300) that a pilot signal was not detected, the sensing manager 46 sets (312) a loop counter c equal to the WM screening variable $n_s$ (default value=1) and sets a decision vector member ($D_{C-N-s}$) indexed by the Channel-N-scan variable to zero. The sensing manager then begins analyzing the WM decision vector by examining each decision passed from the wireless microphone detection logic 37 to determine (314) if the decision ($d_{wm}(c)$) is equal to 1, i.e. a localized energy cluster was detected as described above with reference to FIG. 8. If so, the sensing manager sets (316) $D_{C-N-s}$ equal to 1. In either case, the sensing manager 46 increments (318) the loop counter c by one and determines (320) if the loop counter c is greater than $N_s$, which has a default value of the last WM sensing window. If the loop counter c is less than or equal to $N_s$, the inspection loop (314-320) repeats. Otherwise, the sensing manager 46 increments (322) the variable Channel-N-scan by one and determines (324) whether Channel-N-scan is greater than (M), which represents the number of scans to be performed for each channel on which a DTV signal was not detected. In accordance with one embodiment of the invention, M is dynamically computed by the sensing manager based on the number of channels in the channel sensing matrix, less the number of channels occupied by a DTV signal, as determined by the sensing manager 46 in the first scan, given the regulated minimum channel scan time of 30 seconds. Typically, M is equal to about 30.

If the sensing manager 46 determines (324) that Channel-N has been scanned the requisite number of times (324), the sensing manager 46 makes a decision about whether that channel is white space. In one embodiment of the invention, the decision about whether the channel is white space is made by examining each Channel-N sensing decision $D_{C-N-s}$. To accomplish this, the sensing manager 46 initializes a counter T to zero; sets the loop counter c equal to M, which represents the number of scans completed; and, sets a binary white space decision ($d_{ws}$) equal to 1. The sensing manager then tests each stored Channel-N sensing decision, respectively stored as described above at (316), in descending order from M to 1. If the Channel-N sensing decision $D_{C-C-s}$ is equal to 1 (wireless microphone or other narrowband signal sensed during that Mth channel scan), the counter F is incremented (332) by 1. Otherwise, the white space decision $d_{ws}$ is set (330) to zero. In either event the loop counter c is decremented (334) by one, and c is tested to determine (336) if one third ⅓ of M (c=M/3*2) of the Channel-N sensing decisions have been tested. If so, the white space decision $d_{ws}$ is tested (338) to determine if it is still equal to 1. If $d_{ws}$ is still equal to 1, at least all of the last one third of the Channel-N sensing decisions were positive (equal to 1), and Channel-N is declared to be occupied by a wireless microphone or other narrowband signal. Consequently, the sensing manager terminates analysis of that channel and returns to (308) where Channel-N is set to the next channel to scan, or it is determined that scanning is completed. If $d_{ws}$ is not equal to 1, the loop counter c is examined (340) to determine whether all of the Channel-N sensing decisions have been tested. If not, the loop 328-340 continues to be executed until all of the Channel-N sensing decisions have been tested. When c equals zero, T is tested (342) to determine if it is equal to at least one half of M ($T \geq M/2$), i.e. a wireless microphone or other narrowband signal was detected in at least one half of the Channel-N scans, regardless of an order of the scans in which those signals were detected. If not, the sensing manager 46 inspects the field sync decision from the field sync detection logic 45 and determines (344) whether a DTV field sync signal was detected ($d_{FS}=1$). If not, the Channel-N frequency and any other relevant parameters are passed (344) by the sensing manager 46 via the interface 22 (FIG. 1) to the transceiver of the TV band device 20 and the process ends. If so, the sensing manager 46 updates the channel sensing matrix 48 to indicate that Channel-N is not white space and sets (308) Channel-N to the next channel to sense, unless channel sensing is completed, and the processes described above are repeated.

As will be understood by those skilled in the art, the decision process shown in FIG. 9 is exemplary only and other equally efficacious methods of declaring white space using the testing methods in accordance with the invention are within the ability of a person of ordinary skill in the art.

The embodiments of the invention described above are therefore intended to be only exemplary of the television band device 20 in accordance with the invention, and not a complete description of every algorithm that could be used to declare a white space channel using the methods in accordance with the invention. The scope of the invention is therefore intended to be limited solely by the scope of the appended claims.

We claim:

1. A television band device, comprising:
DTV pilot signal detection logic that searches for a DTV pilot signal in a smoothed power spectrum derived from a television channel signal frequency translated to a television channel signal centered at an intermediate frequency and generates DTV pilot signal detection decisions associated with the monitored television channel;
wireless microphone detection logic that searches for wireless microphone or narrowband signals in the smoothed power spectrum and generates wireless microphone detection decisions associated with the monitored television channel; and
a sensing manager that receives the DTV pilot signal detection decisions and the wireless microphone detection decisions and analyzes at least one the respective decisions to determine whether the monitored television channel is available white space.

2. The television band device as claimed in claim 1 further comprising:
DTV field sync detection logic that searches for a DTV field sync sequence in a baseband representation of the television signal centered at the intermediate frequency and generates DTV field sync detection decisions associated with the monitored television channel; and
the sensing manager analyzes the DTV field sync decisions to determine whether the monitored television channel is available white space if the DTV pilot signal detection decisions and the wireless microphone detection decisions respectively indicate that the monitored television channel is available white space.

3. The television band device as claimed in claim 1 further comprising:
a radio frequency front end controlled by the sensing manager, the radio frequency front end selecting a signal associated with the monitored television channel and outputs a gain controlled analog television channel signal;
an analog-to-digital converter that converts the analog signal to a digital signal; and
a digital down converter that converts the digital representation of the television channel signal centered at the intermediate frequency.

4. The television band device as claimed in claim 3 further comprising:
a down converter and decimator that receives the television channel signal centered at the intermediate frequency and converts it to a baseband signal;
a digital gain controller that automatically controls a gain of the baseband signal;
a square root raised cosine filter and equalizer that filters the baseband signal;
a correlator that correlates the filtered baseband signal with an ATSC field-sync pattern and outputs correlation data to the DTV field sync detection logic.

5. The television band device as claimed in claim 3 further comprising:
a Fast Fourier Transform that receives the television channel signal centered at the intermediate frequency as input and outputs the Fast Fourier Transform of the television channel signal centered at the intermediate frequency as a serial data stream; and
a spectral smoothing filter that receives the serial data stream and outputs the smoothed power spectrum to the DTV pilot signal detection logic and the wireless microphone detection logic.

6. The television band device as claimed in claim 5 wherein the spectral smoothing filter comprises:
a complex conjugate function that computes a complex conjugate of each Fast Fourier Transform bin output in the serial data stream and a multiplier that multiplies the bin output with the complex conjugate to compute a signal power of the bin; and
an exponential averaging filter that adds a weighted average of the signal power of the bin with a weighted average of the signal power of the same bin in a previous FFT cycle to compute the smoothed power spectrum.

7. The television band device as claimed in claim 6 wherein the exponential averaging filter comprises:
a multiplier function that multiplies the signal power of the bin by a first constant to compute a first weighted average;
a multiplier function that multiplies an adjusted average of the signal power of the same bin in the previous FFT cycle by a second constant to compute a second weighted average; and
a summer that adds the first weighted average and the second weighted average to compute the smoothed power spectrum.

8. A television band white space sensor, comprising:
a first down converter circuit that digitizes and down converts a radio frequency front end output television channel signal to a television channel signal centered at an intermediate frequency;
a Fast Fourier Transform that receives the television channel signal centered at the intermediate frequency and transforms it to a complex serial output signal;
a spectral smoothing filter that averages the complex serial output signal to compute a smoothed power spectrum in serial mode;
DTV pilot signal detection logic that receives the smoothed power spectrum, searches the smoothed power spectrum for a DTV pilot signal and outputs DTV pilot signal detection decisions;
wireless microphone detection logic that receives the smoothed power spectrum, searches the smoothed power spectrum for a wireless microphone or other narrowband signal and outputs wireless microphone detection decisions; and
a sensing manager that receives the respective detection decisions from the DTV pilot signal detection logic and the wireless microphone detection logic and analyzes at least one of the respective detection decisions to determine whether the radio frequency front end is tuned to a white space television channel.

9. The television band white space sensor as claimed in claim 8, further comprising:
a down converter and decimator that converts the television channel signal centered at the intermediate frequency to a baseband signal;
a square root raised cosine filter and equalizer (SRRC) that filters the baseband signal and outputs a filtered baseband signal;
a correlator that correlates the filtered baseband signal with a DTV field sync pattern;

DTV field sync detection logic that analyzes output of the correlator to detect a DTV field sync and outputs DTV field sync detection decisions to the sensing manager.

10. The television band white space sensor as claimed in claim 9 wherein the sensing manager further comprises logic for analyzing the field sync detection decisions if the DTV pilot detection decisions and the WM sensing decisions indicate to the sensing manager that the radio frequency front end is tuned to a white space television channel.

11. A method of sensing a white space in a television band, comprising:
   selecting a television channel to sense;
   scanning a television channel signal frequency translated to a signal centered at an intermediate frequency to detect a DTV pilot signal;
   if a DTV pilot signal is detected, selecting a next television signal to sense;
   else, for a predetermined period of time repeatedly selecting the television channel and scanning the signal centered at the intermediate frequency to detect a wireless microphone or other narrowband signal; and
   if the wireless microphone or other narrowband signal is not detected at least a predetermined number of times during the predetermined period of time, confirming the selected television channel to be white space.

12. The method as claimed in claim 11, further comprising:
   scanning a baseband signal derived from the signal centered at the intermediate frequency to detect a DTV field sync pattern;
   if neither the DTV pilot signal nor the wireless microphone or other narrowband signal is detected, determining if the DTV field sync pattern was detected; and
   if the DTV field sync pattern is not detected, confirming the selected television channel to be white space.

13. The method as claimed in claim 12 wherein selecting the television channel to sense is controlled by a sensing manager that selects the television channel and passes frequency parameters to a radio frequency front end connected to an antenna.

14. The method as claimed in claim 13 wherein the sensing manager maintains a channel sensing matrix of television channels to be sensed, and the sensing manager maintains a record in the channel sensing matrix of the number of times each channel is repeatedly selected to detect a wireless microphone or other narrowband signal.

15. The method as claimed in claim 11 wherein scanning the signal centered at the intermediate frequency associated with the television channel to detect the DTV pilot signal comprises:
   using a smoothed power spectrum output by a Fast Fourier Transform that receives the signal centered at the intermediate frequency and a spectral smoothing filter that receives output of the Fast Fourier Transform and outputs the smoothed power spectrum to compute a power level of a first window centered on an expected pilot signal position of an ATSC television signal;
   using the smoothed power spectrum to compute a power level of a second window that does not overlap the first window, the second window being within an occupied bandwidth of the ATSC television signal;
   scaling the power level in second window to equalize a spectrum width over which power is computed in the first and second windows, and computing a power difference between the first window and the second window;
   comparing the power difference with a predetermined threshold; and
   if the power difference exceeds the predetermined threshold, confirming that a DTV pilot signal has been detected.

16. The method as claimed in claim 12 wherein scanning the baseband signal derived from the signal centered at the intermediate frequency to detect the DTV field sync pattern comprises:
   passing the baseband signal to a square root raised cosine filter and equalizer;
   correlating an output of the square root raised cosine filter and equalizer with an ATSC DTV field sync pattern;
   computing an absolute value of the correlator output;
   averaging the absolute value with an immediately previous absolute value using a programmable weighting function;
   multiplying the averaged absolute value with a programmable threshold, while searching for a peak value in a window of a predetermined number of the absolute values;
   comparing the peak value with a product of the multiplication and, if the peak value is greater than the product, determining that a DTV field sync has been detected.

17. The method as claimed in claim 11 wherein scanning the signal centered at the intermediate frequency to detect the wireless microphone or other narrowband signal comprises:
   converting, from a linear scale to decibels, a smoothed power spectrum output by a Fast Fourier Transform that receives the signal centered at the intermediate frequency and a spectral smoothing filter that receives output of the Fast Fourier Transform and outputs the smoothed power spectrum;
   finding a minimum power level and a maximum power level in the converted power spectrum;
   defining a plurality of histogram cells using the minimum power level and the maximum power level;
   computing a power level of a plurality of wireless microphone sensing windows using the smoothed power spectrum;
   computing a frequency histogram using the wireless microphone sensing window power levels;
   estimating a noise power spectral density of the smoothed power spectrum using the frequency histogram;
   converting the estimated noise power spectral density to a linear scale;
   computing a noise power of each one of the plurality of wireless microphone sensing windows;
   computing a noise threshold for each one of the plurality of wireless microphone sensing windows using the noise power; and
   comparing the computed power level with the computed noise threshold for each one of the plurality of wireless microphone sensing windows to determine whether a wireless microphone or other narrowband signal is detected in any one of the plurality of wireless microphone sensing windows.

18. The method as claimed in claim 17 wherein the plurality of wireless microphone sensing windows are overlapped in frequency.

19. The method as claimed in claim 17 further comprising generating a binary wireless microphone decision for each of the wireless microphone sensing windows.

20. The method as claimed in claim 19 further comprising searching for localized signal energy clusters using the wireless microphone sensing decisions by determining if a predetermined number of adjacent wireless microphone decisions are binary 1.

21. The method as claimed in claim 20 determining if the wireless microphone or other narrowband signal was detected at least a predetermined number of times during the predetermined period of time comprises:
   determining if at least one localized signal energy cluster was detected each time the television channel was sensed, and if so setting a corresponding channel scan decision to binary 1, else setting the corresponding channel scan decision to binary 0;
   determining if a predetermined number of the channel scan decisions are binary 1.

22. The method as claimed in claim 21 wherein determining if the predetermined number of the channel scan decisions are binary 1 comprises determining if at least fifty percent of the channel scan decisions are binary 1.

23. The method as claimed in claim 22 further comprising determining that no wireless microphone or other narrowband signal was detected if less than fifty percent of the channel scan decisions are binary 1.

24. A method of sensing a white space in a television band, comprising:
   tuning a radio frequency front end to a frequency associated with a television channel in the television band;
   converting output from the radio frequency front end to a signal centered at an intermediate frequency;
   scanning the signal centered at the intermediate frequency to detect a DTV pilot signal;
   if a DTV pilot signal is detected, tuning the radio frequency front end to a frequency associated with another television channel in the television band;
   else, scanning the signal centered at the intermediate frequency for a wireless microphone or other narrowband signal; and, for a predetermined period of time repeatedly tuning the radio frequency front end to the frequency associated with the television channel and scanning the signal centered at the intermediate frequency to detect the wireless microphone or other narrowband signal; and if a wireless microphone or other narrowband signal is detected, tuning the radio frequency front end to a frequency associated with another television channel in the television band.

25. The method of sensing a white space in a television band as claimed in claim 24, further comprising:
   if the DTV pilot signal and the wireless microphone or other narrowband signal is not detected, converting the signal centered at the intermediate frequency to a baseband signal and scanning the baseband signal to detect a DTV field sync pattern; and
   if the DTV field sync pattern is not detected, confirming the television channel to be white space.

* * * * *